United States Patent
Brilka et al.

(10) Patent No.: US 7,236,049 B2
(45) Date of Patent: Jun. 26, 2007

(54) CIRCUIT ARRANGEMENT AND TRANSISTOR CONTROL METHOD

(75) Inventors: Joachim Brilka, Hamburg (DE); Axel Kattner, Seevetal (DE); Ernst-Peter Ragosche, Stade (DE)

(73) Assignee: NXP B.V., Eindhoven (NL)

( * ) Notice: Subject to any disclaimer, the term of this patent is extended or adjusted under 35 U.S.C. 154(b) by 14 days.

(21) Appl. No.: 10/549,561

(22) PCT Filed: Mar. 16, 2004

(86) PCT No.: PCT/IB2004/000752

§ 371 (c)(1),
(2), (4) Date: Sep. 19, 2005

(87) PCT Pub. No.: WO2004/084404

PCT Pub. Date: Sep. 30, 2004

(65) Prior Publication Data

US 2006/0181329 A1 Aug. 17, 2006

(30) Foreign Application Priority Data

Mar. 20, 2003 (EP) ................................. 03100720

(51) Int. Cl.
*G05F 3/02* (2006.01)

(52) U.S. Cl. ...................................... 327/540; 327/307
(58) Field of Classification Search ................ 327/307, 327/308, 540, 538

See application file for complete search history.

(56) References Cited

U.S. PATENT DOCUMENTS

| 6,339,355 | B1 * | 1/2002 | Yamauchi et al. | 327/307 |
| 2001/0011921 | A1 * | 8/2001 | Ooishi | 327/540 |
| 2003/0076159 | A1 * | 4/2003 | Shor et al. | 327/541 |

FOREIGN PATENT DOCUMENTS

EP 0 957 653 A1 11/1999

* cited by examiner

*Primary Examiner*—Kenneth B. Wells
*Assistant Examiner*—Ryan C. Jager
(74) *Attorney, Agent, or Firm*—Volentine & Whitt P.L.L.C.

(57) ABSTRACT

In order to improve a circuit arrangement (100) and a method of controlling at least one transistor (10, 12, 14, 18), especially of controlling the resistance value of at least one MOS transistor with vanishing DC modulation in such a way that a compensation of resistance variations without control deviation is also possible for the case where the transistor (10, 12, 14, 18) is operated with a vanishing DC voltage, i.e. with a zero DC voltage and indeed without the aid of a reference frequency, it is suggested that in addition to at least a first reference element (10, 20, 70), which has at least a first reference transistor (10) with a first offset from the operating point, at least a second reference element (12, 30, 40, 72, 74, 76) is provided which has at least a second reference transistor (12) with a second offset from the operating point equal in value but opposed in sign to the first buffer storage, wherein an in particular arithmetic average can be formed from the first offset and the second offset for approximating and achieving an optimum operating point.

7 Claims, 2 Drawing Sheets

CIRCUIT ARRANGEMENT AND TRANSISTOR CONTROL METHOD

Figure 1A:
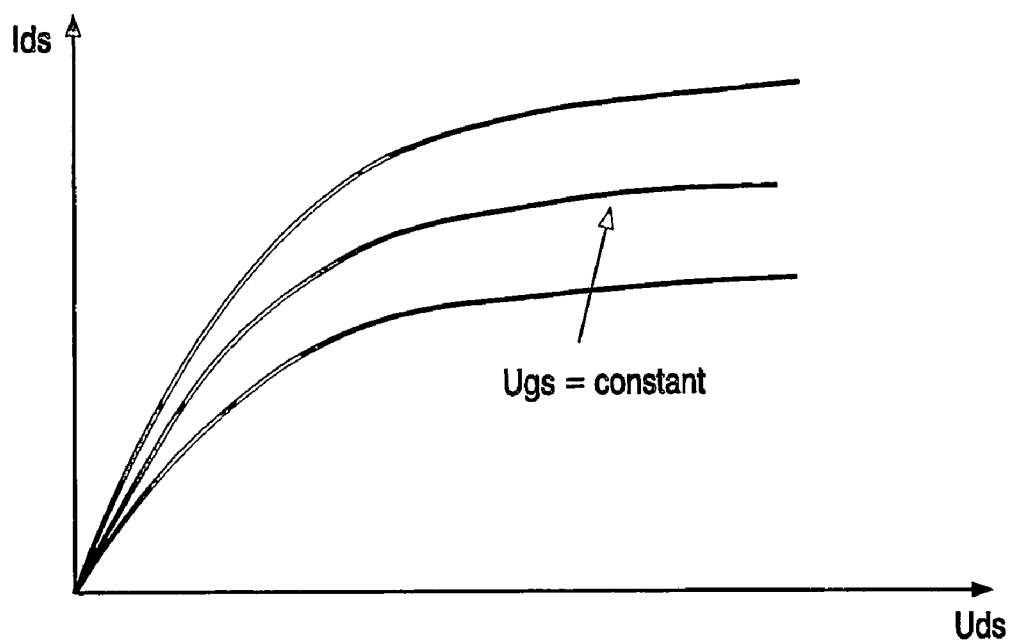

The present invention relates generally to the technical field of electrical or electronic circuit arrangements, in particular, a circuit arrangement and a method of regulating at least one transistor, especially of regulating the resistance value of at least a MOS transistor with vanishing DC modulation.

The regulation of a filter with the help of a reference frequency and a reference filter is described in the document EP 0 957 635 A2. The document EP 0 957 635 A2 particularly discloses a filter circuit to filter at the least a sound carrier in a composite video signal by means of at least one signal filter which has at least a filter frequency that can be adjusted as a function of the control signal.

According to the document EP 0 957 635 A2, the filter circuit comprises a reference filter whose filter frequency can be adjusted as a function of the control signal, which reference filter, when the filter frequency is tuned to the frequency of a reference signal supplied to it, rotates this reference signal with respect to its phase about a defined value; furthermore, a phase comparator is provided to which the output signal of the reference filter and the reference signal are supplied.

From the output signal of the phase comparator is derived the power control signal so that the reference filter is tuned to the frequency of the reference signal; an output signal of a controlled oscillator of a phase-locked loop is used as a reference signal, which phase-locked loop is used for the demodulation of an audio signal modulated to the sound carrier and whose controlled oscillator produces an output signal having the frequency of the sound carrier when the phase-locked loop is in the locked state.

Furthermore, the possibility is known from the state of the art of regulation with an external resistor and with a DC voltage. Two similar currents are then led through the external resistor and through an integrated reference MOS Metal Oxide Semiconductor transistor. The voltage drops across the external resistor and across the integrated reference MOS transistor are compared by a comparator element, whose output voltage is stored in a condenser element and is supplied as a control voltage to the gate of the reference MOS transistor.

With this kind of regulation with the external resistor and with a DC-voltage, the steady-state, stable operating point is reached, if the MOS transistor has the same resistance value as the reference transistor, so that the voltage drops across the external resistor and across the internal MOS transistor are the same. The control voltage is simultaneously supplied to all other similarly constructed, MOS transistors that are to be co-regulated.

If the actual operating condition of the MOS transistors to be jointly controlled deviates from that of the regulated reference MOS transistor, for example in the form of a vanishing DC voltage across only one of the MOS transistors, this will lead to an undesirable and detrimental control deviation.

Starting from the aforesaid disadvantages and shortcomings and taking into account the outlined state of the art, the present invention has for its object to further develop a circuit arrangement of the type described in the opening paragraph and a method associated with this circuit arrangement of the type described in the opening paragraph, such that an adjustment of resistance variations is also possible without control deviation for the case where the MOS transistor is operated with a diminishing direct current that is, with a zero direct current, and indeed without the aid of a reference frequency.

This object is achieved by an electric or electronic circuit arrangement having the characteristics given in claim 1 and by a method having the characteristics given in claim 6. Advantageous embodiments and effective further embodiments of the present invention are featured in the respective dependent claims.

According to the teaching of the present invention, a completely new kind of approach for an improved resistance control of at least a MOS transistor, whose DC modulation is equal to zero, is therefore made available. In this connection the present invention depends on building the reference element a second time by corresponding insertion of two reference transistors having each a positive and an equally large negative storage operating point offset and an approximation to the desired operating point is realized by averaging these offsets, the principle of the present invention in other words corresponding to the substitution of the secant for the tangent of a curved graph.

The circuit arrangement according to the present invention and the method according to the present invention follow the principle of regulating the resistance value of the at least one MOS transistor, which has a zero DC voltage drop, that is, a vanishing DC voltage which means, for example, that only an AC signal (Alternating Current) is supplied to the at least one MOS transistor that is to be controlled.

To regulate the resistance value of the at least one MOS transistor, according to the invention an emulation takes place with a direct current instead of an alternating current, for which purpose a positive DC voltage drop and a negative DC voltage drop are produced across the respective at least two reference MOS transistors. Then the (absolute) arithmetical mean is calculated and compared with a DC voltage drop caused by at least one external resistor element. The voltage of the comparator element arising from this comparison is used to control the MOS transistor or the MOS transistors.

The circuit arrangement according to the present invention and the method according to the present invention have a multiplicity of advantages in that the present invention makes it possible without the aid of a reference frequency to compensate for resistance variations without control deviation for the present application in which the MOS-transistor or the MOS transistors is or are operated with a vanishing DC voltage. Thereby, in a manner significant to the invention, the integration of steep-flank filters is realizable, the integration of which would not be realizable on the basis of high specification requirements without compensating the variations.

Besides the above-described reduction of the control deviation of the MOS transistor operated with a vanishing DC voltage and the above-described reduction of the range of deviation of the regulated filter, a cost reduction through the omission of a reference filter and a frequency generation is also obtained, so that the product according to the invention is more than competitive with its higher precision of frequency and its lower cost compared to products of other manufacturers.

The present invention furthermore relates to a filter circuit comprising at least a circuit arrangement of the kind described above and/or operating by a method of the kind described above.

The present invention furthermore relates to a cable driver provided for an interactive exchange of data and signals, in particular having at least an integrated filter circuit of the kind described above and comprising at least a circuit configuration of the kind described above and/or operating by a method of the kind described above.

Such a type of cable driver is used, for example, in product families for cable modems or for set top boxes and is used, for example:

on the one hand, for suppression of high frequency signals (→low pass function of cable drivers), possibly a suppression of harmonics or a mirrored signal of an analog signal coming from an upstream chip, and on the other hand, for providing a signal with a greater amplitude to a head station (→amplification function of cable driver)

The present invention relates furthermore to the application at least of a circuit arrangement as described above and/or to a method as described above and/or at least to a filter circuit as described above and/or at least to a cable driver as described above in at least a cable modem and/or
in at least a set top box and/or
on the internet via a TV cable.

Functionally, cable modems are modems for cable distribution networks which offer to the end user a bi-directional and high-speed access to the corresponding service provider; in this respect cable modems form an alternative to other broadband technologies, such as DSL (Digital Subscription Line).

To guarantee the bi-directionality, cable modems are constructed with an input channel and a return channel that achieve downstream, i.e. from the head-end to the participant, a bandwidth of, for example, six Megahertz; in a 64 quadrature amplitude modulation (=what is called 64 QAM), transmission speeds of about 10 megabits per second up to about 30 megabits per second can be achieved over such a bandwidth. In upstream, transmission speeds of up to about 10 megabits per second are available for the return channel, in which, as a rule, quadrature phase modulation (so-called QPSK (quadrature phase shift keying) is made use of.

There are cable modems with symmetrical transmission properties for the input channel and return channel and other cable modems with asymmetrical transmission properties. To support L(ocal) A(rea) N(etwork) applications directly, the transmission protocols correspond to those in local networks.

A set top box is a receiving instrument for digital pictures, digital data and/or digital sounds of all sorts. There are set top boxes, also called zapping boxes for uncoded channels, and additionally with common interfaces (CI) for coded channels.

The set top box is connected to the television receiver and decodes coded TV signals, which the TV set cannot receive, into a corresponding standard signal. In addition, the set top box can also accept various additional functions such as descrambling, the resolution or the signal separation for personal computer (PC) applications such as the use of online services, and interactive distribution services such as pay per view, teleshopping, video on demand, or the like.

The present invention finally relates to the use at least of a circuit arrangement as described above, and/or a method as described above to regulate at least an integrated filter without reference frequency, in particular to regulate at least a transistor, more particularly to control the resistance value at least of a MOS transistor with vanishing DC modulation.

As was noted above, there are various possibilities to put the teaching of the present invention into practice in an advantageous manner. For this, on the one hand, the claims dependent on claim 1 are referred to, on the other hand, further embodiments, characteristics, and advantages of the present invention are commented upon in great detail below, with detailed embodiments illustrated in FIGS. 1A, 1B, and 2.

Figure 1B:
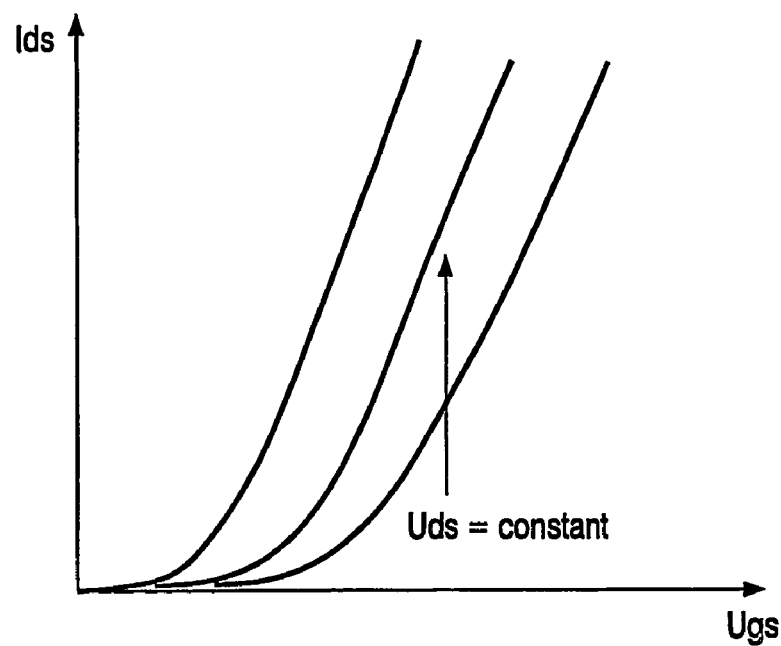
Figure 2:
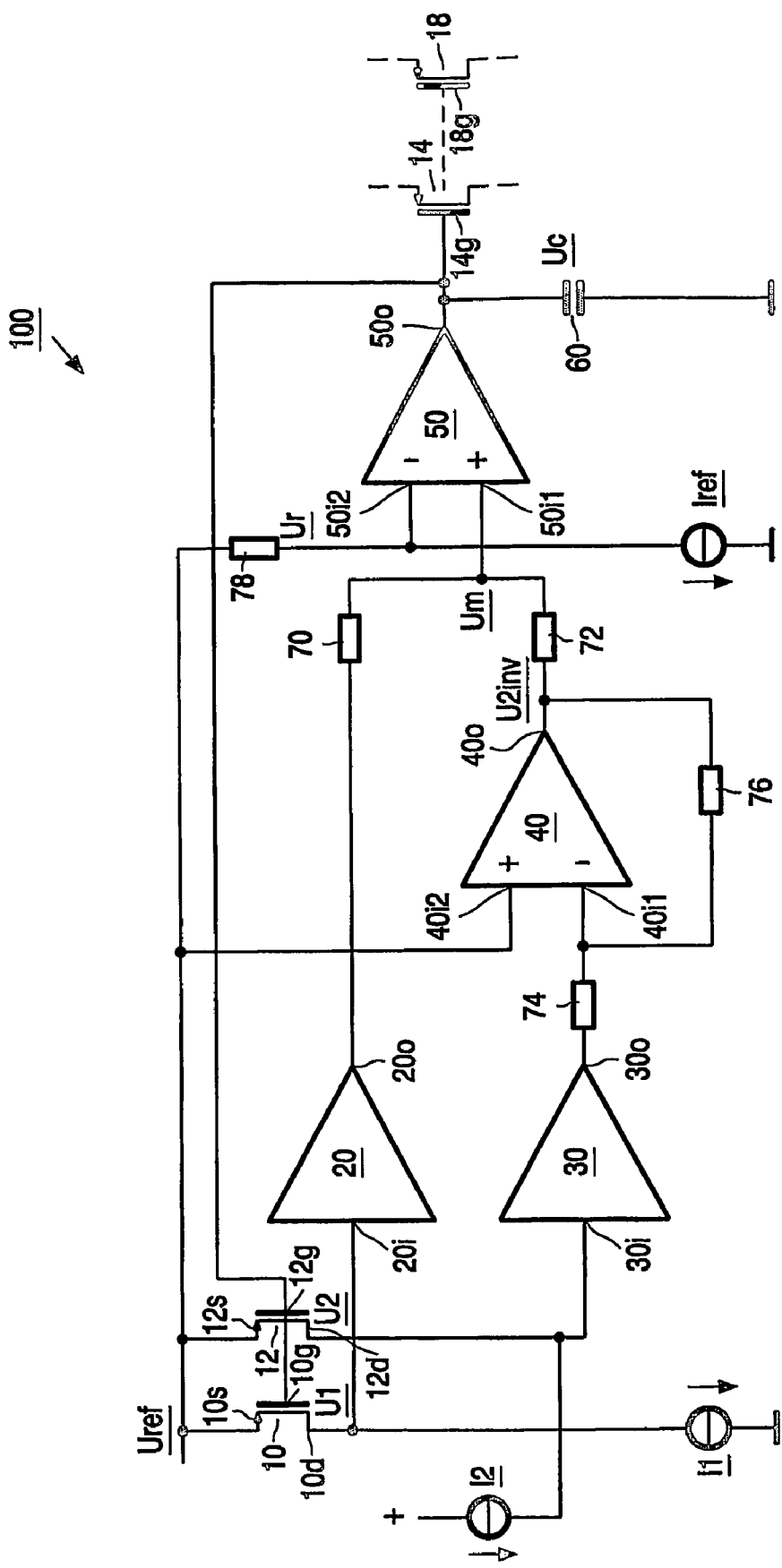

These and other aspects of the invention are apparent from and will be elucidated with reference to the embodiments described hereinafter In the drawings:

FIG. 1A diagrammatically shows three transistor characteristics (drain-source current Ids plotted against drain-source-voltage Uds), for which the respective gate-source-voltage Ugs is constant;

FIG. 1B diagrammatically shows three transistor characteristics (drain-source current Ids plotted against gate-source-voltage Ugs), for which the respective drain-source voltage Uds is constant; and FIG. 2 diagrammatically shows an embodiment of an electric or electronic circuit arrangement according to the present invention which operates according to the method of the present invention, elements and characteristics not being drawn to scale for reasons of easy visibility and recognizability of individual designs.

The same or similar designs, elements, or characteristics have been given the same reference symbols in FIGS. 1A, 1B and 2.

With regard to the technical background of the present invention, it may be commented at first that the channel resistance (=Ud(rain) s(ource) divided by Id(rain) s(ource) of a MOS transistor is dependent, on the one hand, on the gate-source voltage Ugs and, on the other hand, also on the drain-source-voltage Uds, which can be inferred from the representation in FIG. 1A (=3 transistor characteristics, for which the respective gate-source voltage Ugs is constant and from the representation in FIG. 1B (=3 transistor characteristics, for which the respective drain-source voltage Uds is constant).

If now a MOS transistor in the filter is operated with a zero DC voltage across it, i.e. no direct current flows through the MOS transistor (only AC modulation), then the conventional control cannot be applied without control deviation, because the conventional control depends on a non-vanishing direct current (the operating point lies on a curved characteristic; the operating point is displaced in the case of DC modulation).

According to this theoretical introduction, an embodiment for a circuit arrangement 100 is represented in FIG. 2, by means of which the respective resistance values of P-MOS-FETs (=P-metal oxide semiconductor field effect transistors) 10, 12, 14 . . . 18, whose DC modulation is equal to zero, can be controlled.

This circuit arrangement 100 functions corresponding to the method according to the present invention, whereby in addition to a first reference element 10, 20, 70, which comprises the internal first reference MOS-FET 10 with a first offset from the operating point, a second reference element 12, 30, 40, 72, 76 is provided which comprises the internal second reference MOS-FET 12 with a second offset from the operating point equal in value but opposed in sign to the first offset; to approach and attain an optimum operating point as described below, an arithmetic average of the first offset and the second offset is taken.

In detail, starting with a reference voltage Uref, which can be fed to the source connection 10s of the internal, first reference MOS-FET 10 and the source connection 12s of the internal, second reference MOS-FET 12, a reference current Iref produces a voltage Ur with the help of an external resistor 78; the external resistor 78 is connected to the source connection 10s of the internal, first reference MOS-FET 10 as well as to the source connection 12s of the internal second reference MOS-FET 12 for this purpose.

A first current I1 equal to the reference current in conjunction with the internal first reference MOS-FET 10 produces a lower first voltage U1 at the drain connection 10d of the internal first reference MOS-FET 10 than the reference voltage Uref. An equal, but negative second current I2 in conjunction with the internal second reference MOS-FET 12 produces an equal, but opposite or reverse voltage drop, and thus a higher second voltage U2 at the drain connection 12d of the internal second reference MOS-FET 12 compared with the reference voltage Uref.

In this connection, the fact that the second current I2 is equal but opposed to the reference current Iref and to the first current I1 is made clear by the direction of the arrows in the Figures next to Iref, I1 and I2, indicating the technical direction of flow (from plus to minus).

The first voltage U1 is now supplied to the input connection 20i of a first buffer element 20 and is buffered by means of this buffer element 20. Correspondingly, the second voltage U2 is supplied to the input connection 30i of a second buffer element 30 and is buffered by means of this second buffer element 30. Subsequently, the second voltage U2 is inverted with respect to the reference voltage Uref by an operational amplifier 40, which is connected as an inverting amplifier with a gain factor of −1 to the inverted second voltage U2inv.

For this purpose, the output connection 30o of the second buffer element 30 is connected via a resistor 74 to the first, i.e. negative, input connection 40i1 of the operational amplifier 40; the second, i.e. positive input connection 40i2 of the operational amplifier 40 is connected to the source connection 10s of the internal first reference MOS-FET 10, to the source connection 12s of the internal second reference MOS-FET 12, and to the external resistor 78, and is charged with the reference voltage Uref.

In addition, a further resistor 76 is connected in parallel to the first, negative input connection 40i1 of the operational amplifier 40 and to the output connection 40o of the operational amplifier 40.

The buffered first voltage U1 across a first resistor 70, which is connected to the output connection 20o of the first buffer element 20, and the inverted second voltage U2inv across a second resistor 72, which is connected to the output connection 40o of the operational amplifier 40, are then averaged and supplied to a positive input 50i1 of a comparator 50, to whose other, negative input 50i2 the voltage Ur produced by means of the external resistor 78 is applied. For this purpose, the external resistor 78 is connected to the second, negative input 50i2 of the comparator 50.

The comparator 50 compares the mean value Um with the voltage Ur caused by the external resistor 78 and charges or discharges at its output 50o a condenser 60, which is connected not only to the output connection 50o of the comparator 50, but also to the gate 10g of the internal first reference MOS-FET 10, to the gate 12g of the internal second reference MOS-FET 12, and to the respective gate 14g, ..., 18g of all further MOS-FETs 14, ..., 18 to be jointly controlled.

The condenser voltage Uc serves as a control voltage for both reference MOS-FETs 10, 12 and is supplied to their gates 10g, 12g and to the gates 14g, ..., 18g of all further MOS-FETs 14, ..., 18 to be controlled. The control voltage Uc remains unchanged as soon as the mean value Um corresponds to the voltage Ur produced by means of the external resistor 78.

Before discussing the range of application of the circuit arrangement 100 explained above and of the method explained and associated with this circuit arrangement, it may be supplemented, in view of the present invention, that in a M(etal) O(xide) S(emiconductor)-F(ield) E(ffect) T(ransistor) the drain connections and the source connections are, in principle, physically exchangeable; this signifies in the case of the circuit arrangement 100 explained above that the physical "identity" of drain connection and source connection, that is, the option inherent in the invention, to physically exchange the drain connection 10d and the source connection 10s of the internal first reference MOS-FET 10 and/or to physically exchange the drain connection 12d and the source connection 12s of the internal second reference MOS-FET 12, lies within the disclosure and scope of protection of the present invention.

The range of application of the aforesaid circuit arrangement 100 and of the aforesaid method explained and associated with this circuit arrangement 100 extends, for example, to the regulation of integrated filters without reference frequency; thus the present invention is employable, for example, in cable drivers for interactive data and signal exchange. The fields of application of such a cable driver are, among other things, cable modems, set top boxes or the Internet via a TV cable, in which this integrated circuit (IC) is employed.

KEY TO FIGURES

100 Circuit configuration
10 First reference transistor, especially first M[etal] O[xide] S[emiconductor]-F[ield] E[ffect] T[ransistor] with vanishing DC modulation
10d Drain connection of the first reference transistor 10
10g Gate connection of the first reference transistor 10
10s Source connection of the first reference transistor 10
12 Second reference transistor, especially second M[etal] O[xide] S[emiconductor]-F[ield] E[effect] Transistor with vanishing DC modulation
12d Drain connection of the second reference transistor 12
12g Gate connection of the second reference transistor 12
12s Source connection of the second reference transistor 12
14 Third transistor
14g Gate connection of the third transistor 14
18 Fourth transistor
18g Gate connection of the fourth transistor 18
20 First buffer element
20i Input connection of the first buffer element 20
20o Output connection of the first buffer element 20
30 Second buffer element
30i Input connection of the second buffer element 30
30o Output connection of the second buffer element 30
40 Operational amplifier, especially inverting amplifier with an amplification factor of −1
40i1 First, negative input connection of the operational amplifier 40
40i2 Second, positive input connection of the operational amplifier 40
40o Output connection of the operational amplifier 40
50 Comparator element

50i1 First, positive input connection of the comparator element 50
50i2 Second, negative input connection of the comparator element 50
50o Output connection of the comparator element 50
60 Condenser element
70 First resistor
72 Second resistor
74 Third resistor
76 Fourth resistor
78 External resistor
11 First current
12 Second current
Ids Drain-source current
Iref Reference current
U1 First voltage or first voltage drop, especially positive (DC) voltage drop
U2 Second voltage or second voltage drop, especially negative (DC) voltage drop
U2inv Inverted second voltage or inverted second voltage drop, especially inverted DC voltage drop.
Uc Voltage of condenser element 60, especially control voltage
Uds Drain-source voltage
Ugs Gate-source voltage
Um Mean voltage value, especially arithmetic mean voltage value
Ur External voltage or external voltage drop, especially external DC voltage drop
Uref Reference voltage

The invention claimed is:

1. A circuit arrangement for controlling the resistance value of at least one MOS transistor with vanishing DC modulation, comprising:
   at least one first reference element, which comprises at least one first reference transistor with a first offset from an operating point, and
   at least a second reference element, which comprises at least a second reference transistor with a second offset from the operating point equal in value but opposed in sign to the first offset,
   wherein an arithmetic mean is taken of the first offset and the second offset for approximating and reaching an optimum operating point.

2. A circuit arrangement as claimed in claim 1, including:
   at least an external resistor by means of which a reference current produces a voltage on the basis of a reference voltage,
   the first reference transistor, by means of which a first current corresponding in value and in sign to the reference current produces a first voltage,
   at least a first buffer element connected next in line to the drain connection of the first reference transistor or to the source connection of the first reference transistor,
   at least a first resistor connected next in line to the output connection of the first buffer element,
   at least a second reference transistor by means of which a second current equal but opposed to the first current produces a second voltage,
   at least a second buffer element connected to the drain connection of the second reference transistor or to the source connection of the second reference transistor,
   at least an operational amplifier, in particular an inverting amplifier with amplification factor−1,
      whose first, negative input connection is connected next in line to the output connection of the second buffer element and
      whose second, positive input connection is charged with the reference voltage, wherein the second voltage is capable of being inverted to an inverted second voltage with respect to the reference voltage,
   at least a second resistor connected next in line to the output connection of the operational amplifier,
   at least a comparator element,
      whose first, positive input connection is connected next in line to the first resistor and to the second resistor in order to charge this first input connection of the comparator element with a mean voltage averaged over the first resistor and the second resistor, and
      whose second, negative input connection is charged with the voltage produced by means of the external resistor, and
   at least a condenser element connected next in line to the output connection of the comparator element, which can be charged and discharged by the comparator element as a function of the result of a comparison between the mean voltage value and the voltage produced by the external resistor, wherein the respective gates of the first reference transistor, the second reference transistor and of all further transistors to be controlled, as applicable, can be fed with the voltage of condenser element serving as a control voltage, and wherein the optimum operating point corresponding to the control voltage is reached, the moment the mean voltage value corresponds to the voltage produced by the external resistor.

3. A circuit arrangement as claimed in claim 2, wherein the source connection of the first reference transistor or the drain connection of the first reference transistor and the source connection of the second reference transistor or the drain connection of the second reference transistor are chargeable with the reference voltage.

4. A circuit arrangement as claimed in claim 2, wherein the first voltage is lower than the reference voltage and the second voltage is higher than the reference voltage.

5. A circuit arrangement as claimed in claim 2, wherein, at least a third resistor is connected between the output connection of the second buffer element and the first, negative input connection of the operational amplifier, and at least a fourth resistor is connected parallel to the first, negative input connection of the operational amplifier and to the output connection of the operational amplifier.

6. A method of controlling the resistance value of one or more MOS transistors with vanishing DC modulation, wherein
   a first reference transistor produces a positive voltage drop,
   a second reference transistor produces a negative voltage drop,
   the negative voltage drop is inverted to an inverted voltage drop,
   an arithmetic mean voltage value is formed from the positive voltage drop and the inverted voltage drop and is compared with an externally caused voltage drop, and
   the resistance values of the first reference transistor, the second reference transistor and all further transistors whose resistance values are to be controlled, as applicable, are regulated by means of a control voltage formed by the comparison of the mean voltage value and the externally caused voltage drop.

7. A device for controlling a resistance value of one or more MOS transistors, comprising:
- a first reference element, including a first reference transistor adapted to produce a first voltage less than a reference voltage by a first offset voltage;
- a second reference element, including,
  - a second reference transistor adapted to produce a second voltage greater than the reference voltage by the first offset voltage, and
  - a circuit adapted to convert the second voltage to a third voltage less than the reference voltage by the first offset voltage;
- a resistor adapted to produce a fourth voltage from a voltage drop across the resistor as a result of a reference current passing therethrough;
- a comparator adapted to compare the fourth voltage with an arithmetic mean of the first and third voltages; and
- a condenser having a terminal connected to an output of the comparator,
- wherein the comparator is adapted to charge and discharge a control voltage at the terminal of the condenser in response to the comparison of the fourth voltage and the mean of the first and third voltages, and
- wherein the control voltage is provided to a control terminal of each of the one or more MOS transistors whose resistance values are to be controlled, and to control terminals of the first and second reference transistors.

* * * * *